United States Patent
Frey et al.

(10) Patent No.: US 7,902,793 B2
(45) Date of Patent: Mar. 8, 2011

(54) METHOD FOR DETERMINING THE INTERNAL RESISTANCE OF A BATTERY

(75) Inventors: Bernd Frey, Kirchheim (DE); Burkhard Iske, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 657 days.

(21) Appl. No.: 11/793,085

(22) PCT Filed: Nov. 16, 2005

(86) PCT No.: PCT/EP2005/056001
§ 371 (c)(1),
(2), (4) Date: Mar. 18, 2008

(87) PCT Pub. No.: WO2006/072501
PCT Pub. Date: Jul. 13, 2006

(65) Prior Publication Data
US 2008/0258734 A1    Oct. 23, 2008

(30) Foreign Application Priority Data
Dec. 29, 2004  (DE) .......................... 10 2004 063 163

(51) Int. Cl.
*H02J 7/00* (2006.01)
(52) U.S. Cl. ........................ 320/132; 324/426; 324/430
(58) Field of Classification Search .................. 320/132, 320/DIG. 22; 324/430
See application file for complete search history.

(56) References Cited

U.S. PATENT DOCUMENTS

| | | | |
|---|---|---|---|
| 5,563,479 A * | 10/1996 | Suzuki ........................... | 318/139 |
| 5,680,050 A * | 10/1997 | Kawai et al. ................... | 324/427 |
| 5,789,924 A * | 8/1998 | Okada ........................... | 324/428 |
| 5,821,756 A | 10/1998 | McShane et al. | |
| 5,847,566 A * | 12/1998 | Marritt et al. ................. | 324/427 |
| 6,061,639 A * | 5/2000 | Wistrand ........................ | 702/63 |
| 6,232,747 B1 * | 5/2001 | Takahashi et al. ............ | 324/427 |
| 6,477,024 B1 * | 11/2002 | Kikuchi et al. ................. | 361/79 |
| 6,515,454 B2 | 2/2003 | Schoch | |
| 6,909,287 B2 * | 6/2005 | Bertness ........................ | 324/427 |
| 7,138,773 B2 * | 11/2006 | Kumar ........................ | 318/400.27 |
| 2002/0157882 A1 * | 10/2002 | Kubo et al. ..................... | 180/65.3 |
| 2004/0135547 A1 * | 7/2004 | Eifert et al. .................... | 320/132 |
| 2004/0178798 A1 * | 9/2004 | Kikuchi et al. ............... | 324/426 |
| 2004/0239333 A1 * | 12/2004 | Kikuchi ........................ | 324/434 |
| 2005/0035742 A1 * | 2/2005 | Koo et al. ...................... | 320/149 |
| 2005/0052158 A1 * | 3/2005 | Meissner ....................... | 320/132 |
| 2006/0001429 A1 * | 1/2006 | Huang ............................ | 324/426 |
| 2006/0022642 A1 * | 2/2006 | McGee et al. ................. | 320/132 |
| 2006/0055373 A1 * | 3/2006 | Bopp et al. ..................... | 320/132 |
| 2007/0114971 A1 * | 5/2007 | Uesaka et al. ................. | 320/132 |

FOREIGN PATENT DOCUMENTS

| | | |
|---|---|---|
| DE | 102 08 020 | 9/2002 |
| EP | 1 081 499 | 3/2001 |

* cited by examiner

*Primary Examiner* — Edward Tso
*Assistant Examiner* — Arun Williams
(74) *Attorney, Agent, or Firm* — Kenyon & Kenyon LLP

(57) ABSTRACT

A method for determining the internal resistance of a battery, in particular a lead-acid vehicle battery, and an associated device for performing the method are described, in which differential values are calculated from the measured values for the voltage and the current, and these differential values are processed with the aid of a regulator, such as an integrator or a PID regulator. A signal results at the output of the regulator, which corresponds to the reciprocal value of the internal resistance of the battery. This signal is taken into consideration again in each following computing step. The functional capability may be inferred from its internal resistance.

10 Claims, 1 Drawing Sheet

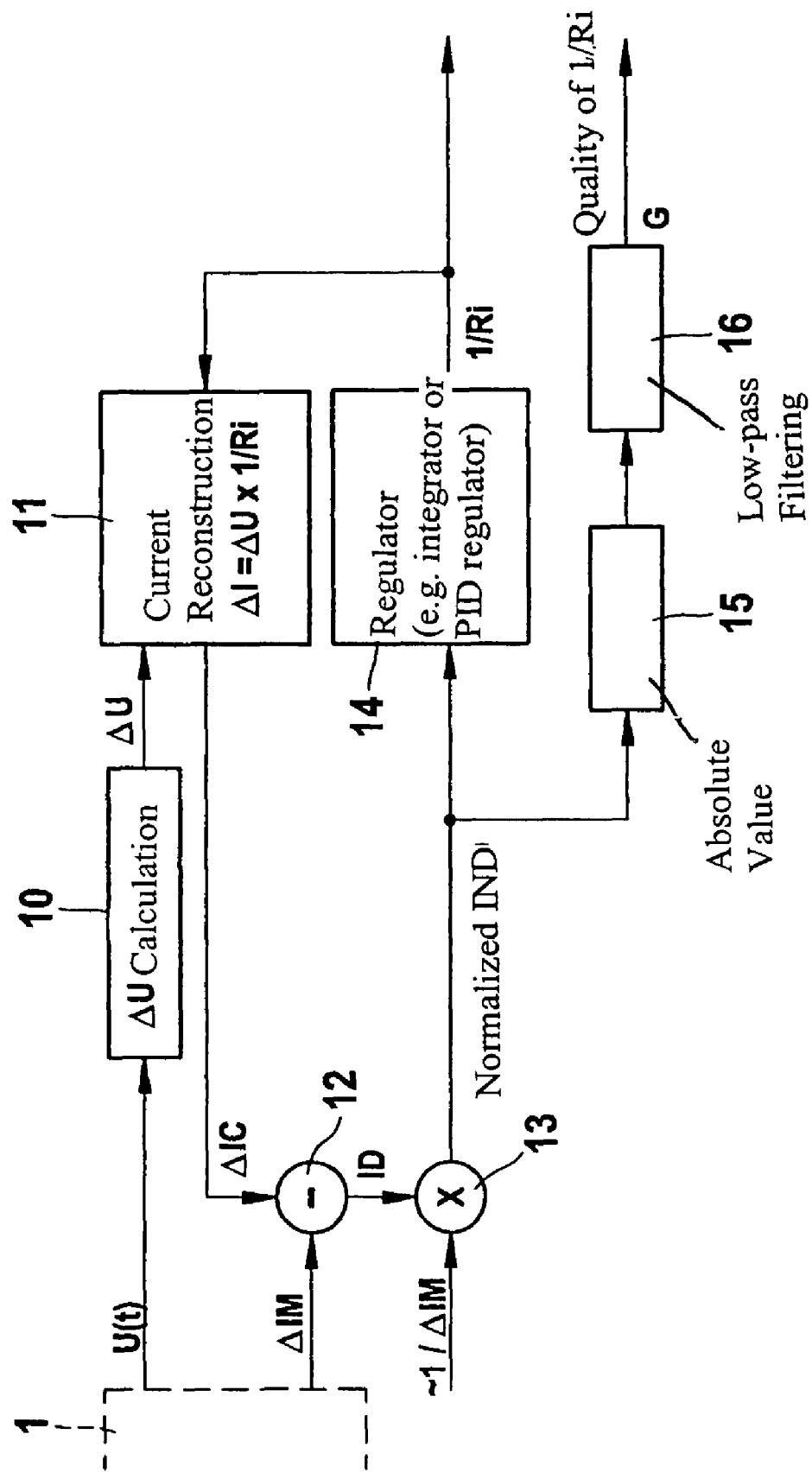

METHOD FOR DETERMINING THE INTERNAL RESISTANCE OF A BATTERY

FIELD OF THE INVENTION

The present invention relates to a method for determining the internal resistance of a battery, in particular a lead-acid battery for a motor vehicle electrical system.

BACKGROUND INFORMATION

In vehicles, security-relevant functions are increasingly based on electrically operated components. It is therefore essential to ensure that these components can be supplied at all times with sufficient electrical energy so that their functional capability is ensured. The generator and the battery are available as providers of the electrical energy in the vehicle, it being the task of the battery to compensate for short-term loads. For it to be capable of fulfilling this task, it is necessary to be able to make statements about its performance capability at any time. Therefore, there are already multiple suggestions as to how the performance capability of a battery, in particular a vehicle battery, may be ascertained continuously.

A measure of the performance capability of a battery is its internal resistance. A completely operational battery has a lower internal resistance than an aged battery, which is no longer very powerful. Because it is known that the internal resistance of the battery is a measure of its performance capability, there are already suggestions as to how the internal resistance of a battery may be ascertained and the functional capability of the battery may be inferred therefrom. A method and a device for determining the internal resistance of a battery are known, for example, from DE 102 08 020 A1. In this known method, the internal resistance of a motor vehicle battery is determined by calculating the quotient of a voltage change in relation to a current change in the event of a vehicle electrical system excitation. A vehicle electrical system excitation is understood, for example, as the connection or disconnection of a powerful electrical consumer, which causes voltage oscillations. In the known method, it is necessary to continuously measure both the flowing current and also the voltage. Because the quality of the determined internal resistance is very heavily dependent on the level of the vehicle electrical system excitation, supplementary methods are necessary, which determine the quality or significance of the particular instantaneously ascertained internal resistance via the amplitude or power of the vehicle electrical system excitation and take it into consideration in a downstream filter.

Because the internal resistance of a battery is ascertained as a function of current and voltage oscillations in the known method and significant difficulties may occur in this, it is suggested that multiple parallel filters having different time constants additionally be used for the current and voltage signal. The starting values are evaluated and finally used for releasing the instantaneously ascertained internal resistance. The necessary case differentiations and dependencies of the individually employed modules on one another make systematic analysis of the overall system and the overall functionality more difficult in all operating cases.

SUMMARY OF THE INVENTION

In contrast, the exemplary method according to the present invention for determining the internal resistance of a battery, in particular a motor vehicle battery, having the features of claim 1 has the advantage of operating very simply and reliably. These advantages are achieved by using a regulating algorithm which outputs the internal resistance of the battery as an output variable. The various modules, filters, and dependencies are thus dispensed with and systematically protecting the functionality in all operating cases is thus made easier.

Further advantages of the exemplary embodiment and/or exemplary method of the present invention are achieved by the measures specified in the subclaims. It is very advantageous that even very short flanks, in particular voltage flanks, which occur when consumers are connected or disconnected, for example, may be analyzed using the regulating algorithm employed. The quality of the ascertained internal resistance is better the greater the amplitude of the analyzed flanks; however, this influence is automatically compensated for by the advantageous regulating algorithm, by which the reliability of the exemplary method according to the present invention is improved.

It is also advantageous that the regulating algorithm does not require calculation of the quality or significance of voltage flanks, because it does not need the quality as an input variable. Because the adaptation speed is not permanently defined via thresholds, but rather is implicitly established via the time constants of the regulator, particularly simple adaptation is possible. Neither final filtering of the ascertained internal resistance nor filtering of current and voltage values for the final release has to be performed.

The exemplary device according to the present invention for performing the method for determining the internal resistance of a battery includes a regulator structure which is distinguished in relation to the related art by a reduction of modules, by which the computing time is advantageously shortened. The functional capability of the system is ensured for all operating cases.

In a further advantageous embodiment, a measure of the quality and/or variance of the internal resistance determination may be extracted from the overall system using few additional elements.

BRIEF DESCRIPTION OF THE DRAWINGS

The FIGURE shows a block diagram of an exemplary embodiment of the present invention, and explained in greater detail in the following description.

DETAILED DESCRIPTION

The device according to the present invention for performing the method for determining the internal resistance of a battery 1 is shown in the single FIGURE as a block diagram and specifically includes a block 10 for $\Delta U$ calculation, a block 11 for current reconstruction, a difference generator 12, a block 13 for multiplication and/or division, a regulator 14, and optionally an absolute-value generator 15 and a low-pass filter 16. The individual blocks are connected to one another as shown in the block diagram. The following measured variables are supplied: instantaneous voltage measured value $U(t)$, a differential value for measured current $\Delta IM$, and a value $\sim 1/\Delta IM$. Variable $1/R_i$ may be tapped at the output of the regulator. The quality of $1/R_i$ is available as value G at the output of low-pass filter 16. The device illustrated may be implemented in a circuit or as a component of a digital circuit, in particular a computer.

To determine the internal resistance of battery 1, firstly a voltage difference $\Delta U$ is calculated from the difference between an instantaneous voltage measured value $U(t)$ measured using a voltmeter (not described in greater detail) and a voltage value $U(t-n)$ measured in the past. If the voltage value measured in the past is, for example, the preceding measured value, then n=1. For voltage difference ΔU, the following equation applies:

$$\Delta U = U(t-n) - U(t)$$

This voltage difference ΔU is multiplied by the reciprocal value of an assumed battery internal resistance 1/Ri and provides a calculated value for current difference ΔIC associated with the time range. The following equation applies:

$$\Delta IC = \Delta U * 1/Ri$$

This calculated value for ΔIC is compared to actual measured value ΔIM, which is measured using a current sensor, for example, to calculate current difference ΔID. The following equation applies:

$$\Delta IM = I(t-n) - I(t)$$

and:

$$ID = IM - IC$$

The value obtained for ID is provided as a regulating deviation to a regulator 14, such as an integrator. The output of the integrator, which corresponds to the reciprocal value of internal resistance 1/Ri, is in turn used as the input for the calculation of subsequent ΔIC and/or for the subsequent current reconstruction. In this way, the particular reciprocal value of internal resistance 1/Ri results at the output of regulator 24.

In order to implement the regulation independently of the instantaneous excitation amplitude, i.e., independently of a voltage oscillation to be analyzed, for example, it is advantageous to normalize value ID, which corresponds to the percentage error of the reciprocal value of the internal resistance, before it is supplied to the regulator, and thus obtain a normalized current difference IND. It is thus ensured that no effects of the excitation flank act on the result. The normalizing is performed in block 13.

A measure of the quality of the internal resistance determination may be calculated by first removing the sign from the normalized value of ID, which corresponds to the percentage error of the reciprocal value of the internal resistance, and then processing it in absolute-value generator 15. A subsequent low-pass filtering in low-pass filter 16 is advantageous and directly results in a measure G for the quality of 1/Ri at the output of the low-pass filter. This calculation is optionally performed and is not absolutely necessary to determine Ri.

The method performed has the advantage that very few simple computing operations are needed and only requires one division for the normalization. The method was described for the analysis of an instantaneous voltage value and a current difference. If current and voltage are switched and a value I(t) is processed instead of U(t) and SUM is processed instead of ΔIM and the associated calculations are adapted accordingly, the output value of regulator 14 provides internal resistance Ri of battery 1 directly instead of the reciprocal value of internal resistance 1/Ri. All charge accumulators coming into consideration, whose performance capability is related to the internal resistance, are to be viewed as battery 1. The functional capability and/or the storage capacity or the charge state of the battery may be concluded on the basis of the ascertained internal resistance.

What is claimed is:

1. A method for determining an internal resistance of a battery, the method comprising:
   measuring the current and the voltage;
   performing an analysis based on measured current values and measured voltage values;
   determining a voltage difference;
   performing a current reconstruction from the determined voltage and a reciprocal value of an internal resistance of the battery;
   determining a current difference between the determined current reconstruction and another current difference that is ascertained from measured currents;
   normalizing the current difference; and
   supplying the normalized current to a regulator, at whose output the reciprocal value for the internal resistance of the battery results.

2. The method of claim 1, wherein the reciprocal value of the internal resistance available at the output of the regulator is considered in the current reconstruction.

3. The method of claim 1, wherein the regulator operates as one of an integrator and a PID regulator.

4. The method of claim 1, wherein the normalized current is supplied to an absolute-value generator, and an absolute value obtained for the current reconstruction is smoothed using a low-pass filter which outputs a signal corresponding to a quality of the reciprocal value of the internal resistance of the battery.

5. The method of claim 1, wherein the battery is a vehicle battery.

6. A device for determining an internal resistance of a vehicle battery, the device comprising:
   a determining arrangement to determine a voltage difference;
   a current reconstruction arrangement to determine a current reconstruction;
   a difference generator to generate a difference;
   one of a multiplication arrangement and a division arrangement; and
   a regulator;
   wherein to determine the internal resistance of the battery, the following are performed:
      measuring the current and the voltage;
      performing an analysis based on measured current values and measured voltage values;
      determining the voltage difference;
      performing the current reconstruction from the determined voltage and a reciprocal value of an internal resistance of the battery;
      determining a current difference between the determined current reconstruction and another current difference that is ascertained from measured currents;
      normalizing the current difference; and
      supplying the normalized current to the regulator, at whose output the reciprocal value for the internal resistance of the battery results.

7. The device of claim 6, further comprising:
   an absolute-value generator; and
   a low-pass filter;
   wherein the normalized current difference is supplied to the absolute-value generator.

8. The device of claim 6, wherein the regulator includes one of a PID regulator and an integrator.

9. The device of claim 6, wherein the determining arrangement, the current reconstruction arrangement, the difference generator, the one of the multiplication arrangement and the division arrangement, and the regulator are part of a vehicle control unit.

10. The device of claim 6, wherein the battery is a lead-acid battery, and a functional capability of the battery is inferred from the determined internal resistance.

* * * * *